United States Patent [19]

Meadows

[11] Patent Number: 4,874,969

[45] Date of Patent: Oct. 17, 1989

[54] HIGH SPEED CMOS COMPARATOR WITH HYSTERESIS

[75] Inventor: William H. Meadows, Arlington, Tex.

[73] Assignee: National Semiconductor Corporation, Santa Clara, Calif.

[21] Appl. No.: 204,111

[22] Filed: Jun. 8, 1988

[51] Int. Cl.$^4$ .............................................. H03K 5/24
[52] U.S. Cl. .................................... 307/355; 307/359; 307/494
[58] Field of Search ............... 307/350, 355, 359, 290, 307/494

[56] References Cited

U.S. PATENT DOCUMENTS

| | | | |
|---|---|---|---|
| 4,069,431 | 1/1978 | Kucharewski | 307/355 |
| 4,110,641 | 8/1978 | Payne | 307/355 |
| 4,394,587 | 7/1983 | McKenzie et al. | 307/355 |
| 4,485,312 | 11/1984 | Kusakabe et al. | 307/290 |
| 4,670,671 | 6/1987 | De Weck | 307/355 |

Primary Examiner—John Zazworsky
Attorney, Agent, or Firm—Limbach, Limbach & Sutton

[57] ABSTRACT

A comparator circuit in accordance with the present invention includes a first stage which is a standard CMOS implementation of a differential amplifier. The differential outputs of the first stage are applied to the inputs of a second differential amplifier stage which is of the same design as the first stage. A hysteresis element is added to the current mirror load of the second stage and is driven by an output of the second stage. This second stage output is applied to a threshold matching single-ended gain stage. The output of the gain stage is applied to a standard CMOS inverter which provides the final comparator output. The hysteresis element is placed internally within the second stage to be driven by the second stage output such that the voltage difference between the differential inputs to the second stage must exceed a preselected threshold voltage before the output to the single-ended gain stage switches state.

3 Claims, 1 Drawing Sheet

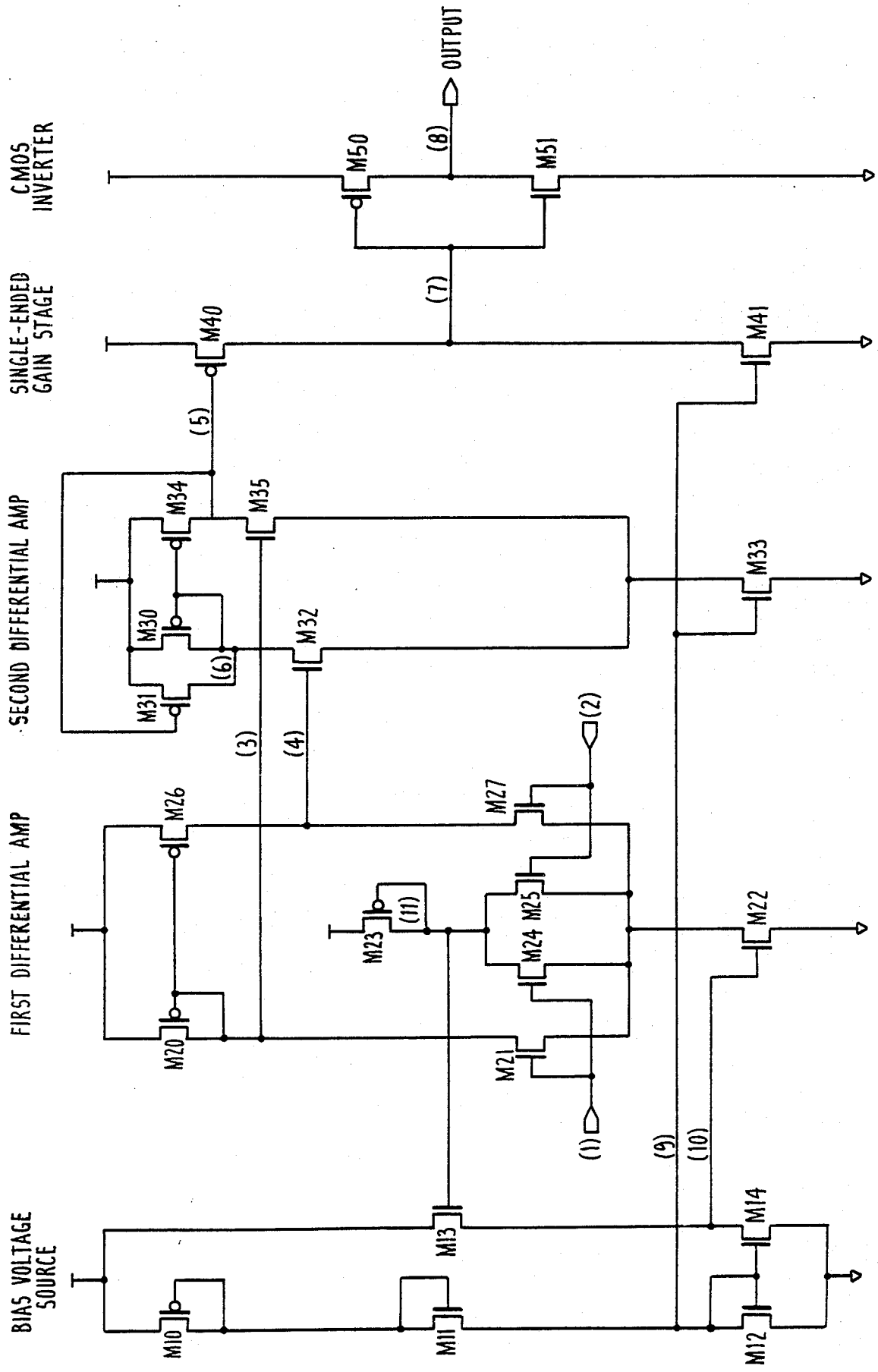

HIGH SPEED CMOS COMPARATOR WITH HYSTERESIS

BACKGROUND OF THE INVENTION

1. Field of the Invention

The present invention relates to electronic circuits and, in particular, to a comparator circuit that utilizes cascaded differential amplifiers for increased gain and speed performance plus a simple, one element hysteresis circuit.

2. Discussion of the Prior Art

A comparator is essentially a differential amplifier running open loop so that there is a considerable amount of amplification. Hysteresis is often added to comparator circuits to prevent the output from changing state as a result of noise fluctuations on the differential inputs.

For example, U.S. Pat. No. 4,670,671, issued June 2, 1987 to De Weck, discloses a CMOS comparator which uses an input differential stage having feedback current mirror loads that provide high speed current signals to an output cascode stage. The current mirror arrangement provides fast signal propagation through the comparator. Hysteresis is established by the output of the comparator being positively fedback through a similar feedback differential stage, thus superimposing controlled current signals into the cascode stage. Hysteresis of the output signal with respect to a differential input signal is controlled by the ratio of biased currents of internal current sources.

U.S. Pat. No. 4,110,641, issued Aug. 29, 1978, to Payne, discloses a CMOS voltage comparator with internal positive current feedback to achieve hysteresis. The voltage level at which the switching occurs is precisely setable. Hysteresis is introduced such that when the set voltage level is exceeded, the output switches quickly and remains in that state until the input voltage drops by a predetermined hysteresis voltage.

U.S. Pat. No. 4,485,312 issued Nov. 27, 1984, to Kusakabe et al, discloses a hysteresis circuit in which a differential pair of transistors is provided for voltage comparison. A bias circuit for setting a reference voltage is connected to the base of one of the differential pair. A second differential pair is provided for reference voltage switching. The transistors of the second differential pair have their bases connected to the collectors of the transistors of the first differential pair as well as to the biased circuit in a positive feedback relationship.

Each of the above-mentioned circuits implements hysteresis either with an additional differential "bleeder" network or with a complicated feedback arrangement around the output stage. Thus, these designs suffer from a number of disadvantages. First, a large number of additional circuit elements are required. Second, critical matching is required among certain circuit elements. Third, the complex convoluted layouts required to implement these designs exhibit attendant increases in parasitic loads. Also, these circuits exhibit reduced switching speed and longer settling times due to the reduced available switching current and parasitic loading.

SUMMARY OF THE INVENTION

The present invention provides hysteresis in a comparator through the addition of a single transistor to a conventional differential gain stage. More specifically, a P-channel hysteresis element is added to the current-mirror load and is driven from the gain stage output. The hysteresis element changes the balance in the current mirror such that the voltage difference between the differential inputs to the gain stage must exceed a preselected threshold voltage before the comparator output changes state.

Thus, a comparator circuit in accordance with one embodiment of the present invention includes a first stage which is a standard CMOS implementation of a differential amplifier. The differential outputs of the first stage are applied to the inputs of a second differential amplifier stage which is of the same basic design as the first stage. The hysteresis element is added to the current mirror load of the second stage and is driven by an output of the second stage. This second stage output is applied to a threshold matching single-ended gain stage. The output of the single-ended gain stage is applied to a standard CMOS inverter which provides the final comparator output. The hysteresis element is placed internally within the second stage to be driven by the second stage output as described above.

A better understanding of the features and advantages of the present invention will be obtained by reference to the following detailed description of the invention and accompanying drawing which set forth an illustrative embodiment in which the principles of the invention are utilized.

DESCRIPTION OF THE DRAWING

The drawing is a schematic diagram illustrating a high speed CMOS comparator circuit with hysteresis in accordance with the present invention.

DETAILED DESCRIPTION OF THE INVENTION

FIG. 1 provides a detailed transistor circuit diagram illustrating a comparator circuit in accordance with the present invention.

The first stage of the circuit is a standard CMOS implementation of a differential amplifier. It includes N-channel input devices M21 and M27, P-channel current-mirror loads M20 and M26, and an N-channel current source M22. Embedded within the differential amplifier is a common-mode amplifier and feedback path, comprising N-channel devices M24 and M25 and P-channel device M23, which helps to extend the operating range of the input elements M21 and M27. This common-mode circuit is described in the literature by Gregorian and Temes, "Analog MOS Integrated Circuits", p. 198.

N-channel devices M24 and M25 serve as supplemental input devices, sharing their commonly-connected drains with the drain of P-channel device M23. This causes the voltage potential at node (11) to vary in a manner that is inversely proportional to the common mode voltage at the input nodes (1) and (2). Node (11) in turn drives N-channel device M13 which, in conjunction with N-channel device M14, and as described further below, supplies bias voltage to current sourcing N-channel device M22.

Output nodes (3) and (4) of the first differential amplifier stage are applied to the inputs of a second differential amplifier gain stage. This second gain stage is of the same design as the first differential amplifier stage but without the common mode amplifier and feedback path. It includes N-channel input elements M32 and M35 which receive inputs (4) and (3), respectively, P-channel current-mirror loads M30 and M34, and N-channel constant current source M33. In accordance with the present invention, a hysteresis element, P-channel device M31, is added to the current-mirror load M30 and is driven from the second stage output node (5).

Node (5) is also applied to the input of a single-ended gain stage. This stage is a typical inverting amplifier. It includes P-channel device M40 and N-channel constant current source M41 and is used for threshold matching. The output of this stage, node (7), is applied to the input of a standard CMOS inverter that includes P-channel device M50 and N-channel device M51. The output node (8) of the CMOS inverter is the final output of the comparator circuit.

A bias voltage source, shown at the left hand side of the drawing, supplies a reference voltage, node (9), to both constant current source M33 and M41. This voltage is generated by P-channel device M10 and N-channel devices M11 and M12 which are arranged as a divider network with desirable temperature and power supply dependencies. In addition, it is an integral part of the common-mode feedback path mentioned earlier and supplies the reference voltage on node (10) for current source M22.

The purpose of the comparator circuit described above is to amplify the voltage difference between input nodes (1) and (2) and then provide an output condition to node (8) which represents the polarity of that difference. The output node (8) assumes a logical state of "1" when the voltage on node (1) is positive with respect to node (2). It assumes a logical state of "0" when the voltage on node (1) is negative with respect to node (2). In addition, the internal hysteresis provided by device M31 is such that the reversal of input polarity must be of sufficient magnitude to exceed the hysteresis level before the output will change state.

For example, as the input voltage on node (1) becomes positive with respect to the voltage on node (2), the transconductance of input device M21 increases. This causes the current through device M20 to increase and that current is reflected into current-mirror device M26. Increased transconductance of input device M21 causes the voltage on node (3) to decrease, and the increased current through device M26 causes the voltage on node (4) to increase. Thus, the output voltage on nodes (3) and (4) move synchronously in opposite directions and the voltage on node (4) moves in phase with the voltage difference between nodes (1) and (2). Thus, the circuit provides an amplified version of the differential voltage present at its inputs.

These two amplified outputs, nodes (3) and (4), are applied to the inputs of the second differential gain stage. This second gain stage operates in the same manner as the first stage and produces output voltages on nodes (5) and (6) which are amplified versions of the differential voltage between nodes (3) and (4).

Only one of these outputs, node (5), is applied to the threshold matching gain stage. As stated above, device M40 and constant current source M41 form an inverting amplifier stage the input threshold of which can be made to match the quiescent operating point of output node (5) by virtue of the current-mirror relationship between the elements M33 and M41.

As stated above, the output of this stage, node (7), is applied to a standard CMOS inverter and the final comparator output is provided on node (8).

Because this last stage is a standard CMOS logic gate, its output will assume a voltage equal to either the ground reference (logic "0") or the power supply (logic "1").

As stated above, the hysteresis in the above-described circuit is provided by element M31. This device is connected in such a way as to oppose the voltage change on nodes (5) and (6). For example, assume an initial state with node (4) negative with respect to node (3). As described above, this will result in a low voltage on output node (5) and a high voltage on node (6). The voltage on node (5) is applied to the gate of hysteresis element M31 so that element M31 is in an "ON" condition and, thus, supplies current to the left side of the current-mirror. This current is added to the current supplied by device M30 and helps to hold node (6) at a high voltage.

If the input voltage on node (4) increases until the voltage difference between node (4) and (5) reverses polarity, since element M31 is supplying additional current, the transconductance of device M32 must increase accordingly before the voltage on node (6) will fall. Necessary transconductance is obtained only when the voltage difference between nodes (3) and (4) exceeds the upper hysteresis threshold. Once this occurs, node (5) will go high, turning element M31 "OFF" and removing its contribution to the current through device M32. This change of state will occur rapidly once the threshold voltage is exceeded.

A similar situation occurs when the input polarity is returned to its initial state. In this case, the voltage different must go beyond the lower hysteresis threshold before node (5) will change state. The hysteresis threshold voltages are controlled by the ratio of currents supplied by devices M30, M31 and M34.

It should be understood that the invention is not intended to be limited by the specifics of the above-described embodiment, but rather defined by the accompanying claims.

What is claimed is:

1. A differential gain stage comprising:
   (a) a constant current source;
   (b) first and second N-channel transistors having their gates connected to receive first and second input signals, respectively, and their commonly connected sources connected to the constant current source, the drain of the first N-channel transistor connected to a first output node, the drain of the second N-channel transistor connected to a second output node;
   (c) a current mirror comprising a first and second P-channel transistors having their commonly-connected gates connected to the first output node and their commonly connected sources connected to a supply voltage, the drain of the first P-channel transistor connected to the first output node, the drain of the second P-channel transistor connected to the second output node; and
   (d) a hysteresis element consisting of a third P-channel transistor having its gate directly connected to the second output node, its source directly connected to the supply voltage and its drain directly connected to the first output node.

2. A differential gain stage as in claim 1 wherein the second output node is connected to a single-ended gain stage comprising:
   (a) a second constant current source; and
   (b) a fourth P-channel transistor having its gate connected to the second output node, its source connected to the supply voltage and its drain connected to the second constant current source.

3. A differential gain stage as in claim 2 wherein the drain of the fourth P-channel transistors is connected to an output inverter stage comprising a fifth P-channel transistor and a fourth N-channel transistor having their gates commonly connected to the drain of the fourth P-channel transistor, their commonly-connected drains connected to an inverter output signal, the source of the fifth P-channel transistor connected to the supply voltage, the source of the fourth N-channel transistor connected to ground whereby the hysteresis element changes the balance in the current mirror such that the voltage difference between the first input signal and the second input signal must exceed a preselected threshold voltage before the output signal changes state.

* * * * *